(12) United States Patent
Tian et al.

(10) Patent No.: US 11,381,245 B1
(45) Date of Patent: Jul. 5, 2022

(54) CLOCK STEP CONTROL CIRCUIT AND METHOD THEREOF

(71) Applicant: Shanghai Biren Technology Co., Ltd, Shanghai (CN)

(72) Inventors: Zheng Tian, Shanghai (CN); YiKai Liang, Shanghai (CN); Linglan Zhang, Shanghai (CN); WenQi Li, Shanghai (CN); DongCai Li, Shanghai (CN); TingTing Yu, Shanghai (CN)

(73) Assignee: Shanghai Biren Technology Co., Ltd, Shanghai (CN)

( * ) Notice: Subject to any disclaimer, the term of this patent is extended or adjusted under 35 U.S.C. 154(b) by 0 days.

(21) Appl. No.: 17/468,686

(22) Filed: Sep. 8, 2021

(30) Foreign Application Priority Data

Aug. 4, 2021 (CN) .......................... 202110889954.2

(51) Int. Cl.
| | |
|---|---|
| *H03K 23/60* | (2006.01) |
| *H03K 23/00* | (2006.01) |
| *H03K 19/08* | (2006.01) |
| *H03K 19/173* | (2006.01) |
| *H03K 21/10* | (2006.01) |

(52) U.S. Cl.
CPC ......... *H03K 23/60* (2013.01); *H03K 19/0813* (2013.01); *H03K 19/1737* (2013.01); *H03K 21/10* (2013.01); *H03K 23/002* (2013.01)

(58) Field of Classification Search
CPC .. H03K 23/60; H03K 23/002; H03K 19/0813; H03K 19/1737; H03K 21/10
USPC .......................................................... 327/407
See application file for complete search history.

(56) References Cited

U.S. PATENT DOCUMENTS

2005/0262374 A1* 11/2005 Shinkawa ............... G06F 1/324
 713/500

* cited by examiner

*Primary Examiner* — Tomi Skibinski
(74) *Attorney, Agent, or Firm* — JCIP Global Inc.

(57) ABSTRACT

The disclosure provides a clock step control circuit and a method thereof. The clock step control circuit includes a clock divider, a multiplexer, and a controller. The clock divider receives a first clock signal and outputs multiple second clock signals. The multiplexer receives the second clock signals and outputs one of the second clock signals. The controller is coupled to the clock divider and the multiplexer. When the controller receives an interrupt signal, the controller outputs a selection signal to the multiplexer according to the interrupt signal. The multiplexer outputs another one of the second clock signals according to the selection signal. The clock step control circuit and the method thereof in the disclosure can appropriately switch the clock signal to output a clock signal with an appropriate clock frequency.

18 Claims, 5 Drawing Sheets

CLOCK STEP CONTROL CIRCUIT AND METHOD THEREOF

CROSS-REFERENCE TO RELATED APPLICATION

This application claims the priority benefit of China application serial no. 202110889954.2, filed on Aug. 4, 2021. The entirety of the above-mentioned patent application is hereby incorporated by reference herein and made a part of this specification.

BACKGROUND

Technology Field

The disclosure relates to a control circuit and a control method, and in particular, to a clock step control circuit and a method thereof.

Description of Related Art

As a demand for the computing power of chips (e.g., high performance computing (HPC) chips or AI accelerator chips) is getting higher and higher, the energy consumption of the high-performance chips is also greatly increasing. However, when peak performance is required, the operating power of a chip may exceed the peak limit of the system design or the chip design, causing the system shutdown, abnormal operations of the core, or even chip damage. However, the conventional over current protection (OCP) mechanism only shuts down or resets the system to an idle state, resulting in performance loss and overshoot issues, and this makes the system process more complicated.

SUMMARY

The disclosure is directed to a clock step control circuit and a method thereof. When an overcurrent event occurs, the clock signal can be appropriately switched to output a core clock signal with an appropriate clock frequency.

According to an embodiment of the disclosure, the clock step control circuit of the disclosure includes a clock divider, a multiplexer, and a controller. The clock divider receives a first clock signal and outputs multiple second clock signals. The multiplexer receives the second clock signals and outputs one of the second clock signals. The controller is coupled to the clock divider and the multiplexer. When the controller receives an interrupt signal, the controller outputs a selection signal to the multiplexer according to the interrupt signal. The multiplexer outputs another one of the second clock signals according to the selection signal.

According to an embodiment of the disclosure, the clock step control method of the disclosure includes steps as follows. A first clock signal is received through a clock divider and multiple second clock signals are output. The second clock signals are received through a multiplexer, and one of the second clock signals is output. A selection signal is output to the multiplexer according to an interrupt signal through a controller when the controller receives the interrupt signal, and another one of the second clock signals is output according to the selection signal through the multiplexer.

In summary, the clock step control circuit and the method thereof in the disclosure are capable of automatically reducing the clock frequency of the clock signal when an overcurrent event occurs, so as to output a core clock signal with an appropriate clock frequency, and the core can maintain the computing power even when an overcurrent event occurs.

In order to make the features and advantages of the disclosure comprehensible, embodiments accompanied with drawings are described in detail below.

DESCRIPTION OF THE EMBODIMENTS

The accompanying drawings are included to provide a further understanding of the disclosure, and are incorporated in and constitute a part of this specification. The drawings illustrate embodiments of the disclosure and, together with the description, serve to explain the principles of the disclosure.

Figure 1:
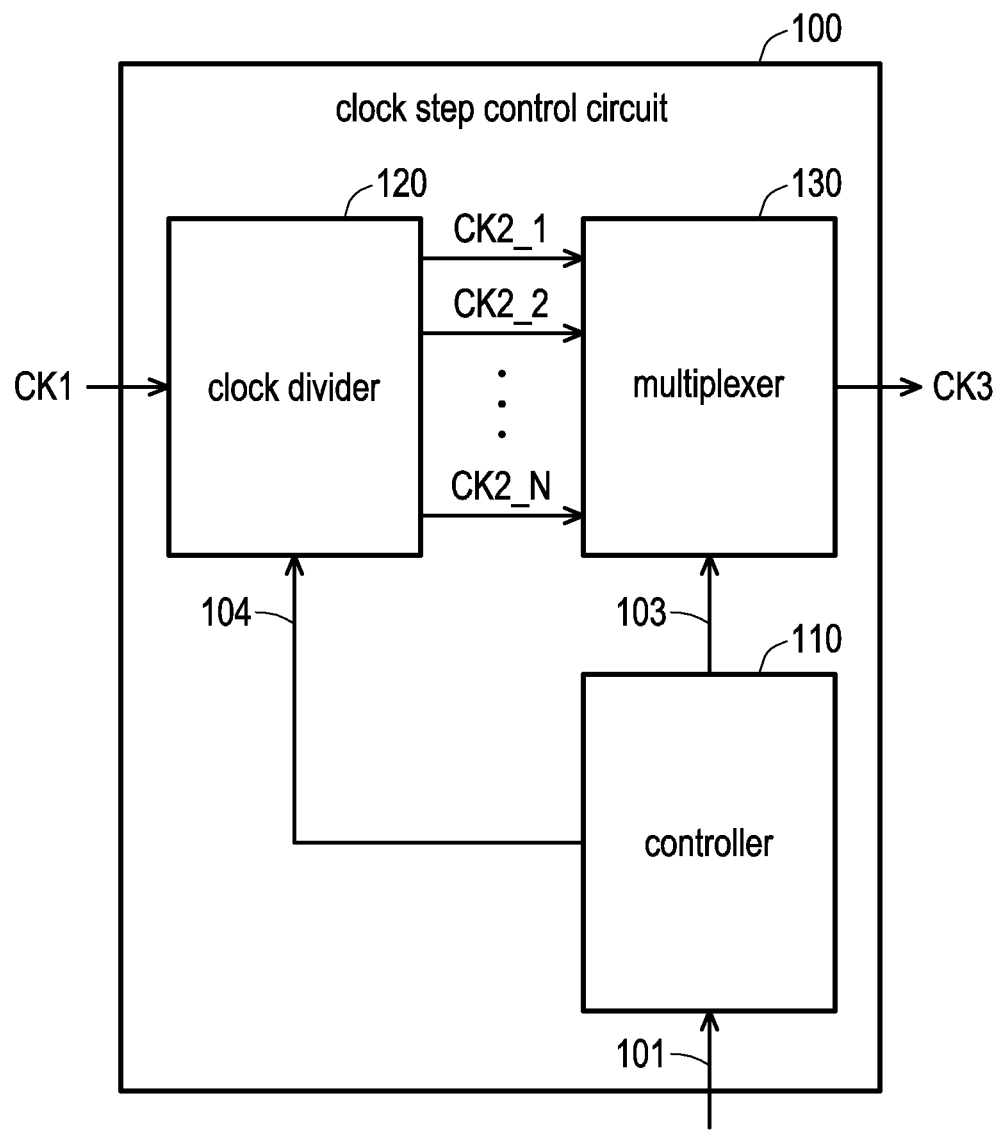
FIG. 1 is a schematic circuit view of a clock step control circuit according to an embodiment of the disclosure.

FIG. 1 is a schematic circuit view of a clock step control circuit according to an embodiment of the disclosure. Referring to FIG. 1, a clock step control (CSC) circuit 100 includes a controller 110, a clock divider 120, and a multiplexer 130. The controller 110 is coupled to the clock divider 120 and the multiplexer 130. The clock divider 120 is coupled to the multiplexer 130. In the embodiment, the clock step control circuit 100 may be disposed in a system-on-a-chip (SoC) and provide a clock signal to the core of the system-on-a-chip (SoC). The system-on-a-chip can be a high performance chip, such as a high performance computing (HPC) chip or an AI accelerator chip, and the like, for example. Moreover, the core may be a micro processor unit (MPU), for example, but the disclosure is not limited thereto. In the embodiment, the multiplexer 130 may be a glitch-free clock multiplexer.

In the embodiment, for example, the clock divider 120 may receive a clock signal CK1 output by a phase-locked loop (PLL) circuit or a first clock signal provided by a voltage-controlled oscillator (VCO) in the phase-locked loop circuit. Moreover, according to the first clock signal CK1, multiple second clock signals CK2_1-CK2_N with different clock frequencies are generated, where N is a positive integer. In the embodiment, the clock divider 120 can provide the second clock signals CK2_1-CK2_N to the multiplexer 130, and by controlling the multiplexer 130, the controller 110 can select one of the second clock signals CK2_1-CK2_N as a core clock signal CK3 to be output to the core of the system-on-a-chip. Therefore, the clock step control circuit 100 of the embodiment can effectively control the clock frequency of the core clock signal CK3 of the system-on-a-chip and can appropriately adjust the performance of the core.

Figure 2:
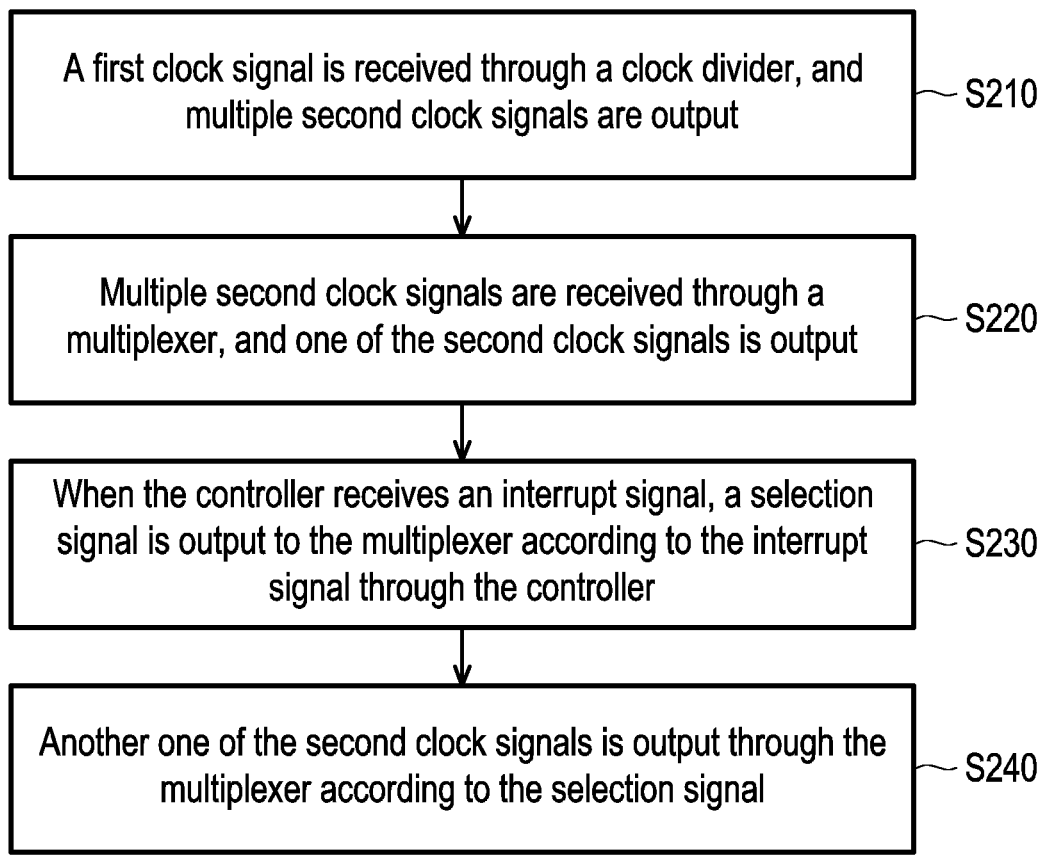
FIG. 2 is a flowchart illustrating a clock step control method according to an embodiment of the disclosure.

FIG. 2 is a flowchart illustrating a clock step control method according to an embodiment of the disclosure. Referring to FIG. 1 and FIG. 2, the clock step control circuit 100 of the embodiment can perform the following steps S210 to S240 to implement the step control function of the clock signal. In step S210, the clock step control circuit 100 may receive the first clock signal CK1 through the clock divider 120 and output multiple second clock signals CK2_1-CK2_N. In the embodiment, the second clock signals CK2_1-CK2_N have different clock frequencies. For example, the second clock signal CK2_1 has the highest clock frequency, and the second clock signal CK2_N has the lowest clock frequency. In step S220, the clock step control circuit 100 may receive multiple second clock signals CK2_1-CK2_N through the multiplexer 130 and output one of the second clock signals CK2_1-CK2_N. In this regard, under normal operation, the controller 110 may control the multiplexer 130 in advance to output a certain second clock signal with a higher clock frequency as the core clock signal CK3 provided to the core, for example.

In step S230, when the controller 110 receives an interrupt signal 101, the clock step control circuit 100 may output a selection signal 103 to the multiplexer 130 according to the interrupt signal 101 through the controller 110. In the embodiment, for example, the interrupt signal 101 can be generated by a voltage regulator (VR) of a system-on-a-chip according to whether the current (power) currently provided to the system or the core is abnormal, or the interrupt signal 101 may be generated by a monitoring result of firmware of the system-on-a-chip that currently monitors the current (power), and the disclosure is not limited thereto.

In step S240, the clock step control circuit 100 may output another one of the second clock signals CK2_1 to CK2_N through the multiplexer 130 according to the selection signal 103. In this regard, when an abnormality of an overcurrent event occurs in the system or the core, the controller 110 may receive the corresponding interrupt signal 101. According to the interrupt signal 101, the controller 110 can generate and output the corresponding selection signal 103 to the multiplexer 130 to control the multiplexer 130 to output another certain second clock signal with a lower clock frequency as the core clock signal CK3 provided to the core. Accordingly, the performance of the core can be automatically and instantly reduced so as to prevent the system shutdown, abnormal operations of the core, and even chip damage. Moreover, when the abnormality of an overcurrent event is removed, the controller 110 can also automatically control the multiplexer 130 to resume outputting a clock signal with a normal clock frequency through the selection signal 103, thereby restoring the performance of the core.

Moreover, in the embodiment, the controller 110 may also output a clock division signal 104 to the clock divider 120 so that the clock divider 120 can generate the second clock signals CK2_1-CK2_N according to the clock division signal 104. The controller 110 can generate the clock division signal 104 according to different clock division requirements. In other words, the number of clock signals with different clock frequencies output by the clock divider 120 can be determined according to different clock frequency modulation requirements.

Figure 3:
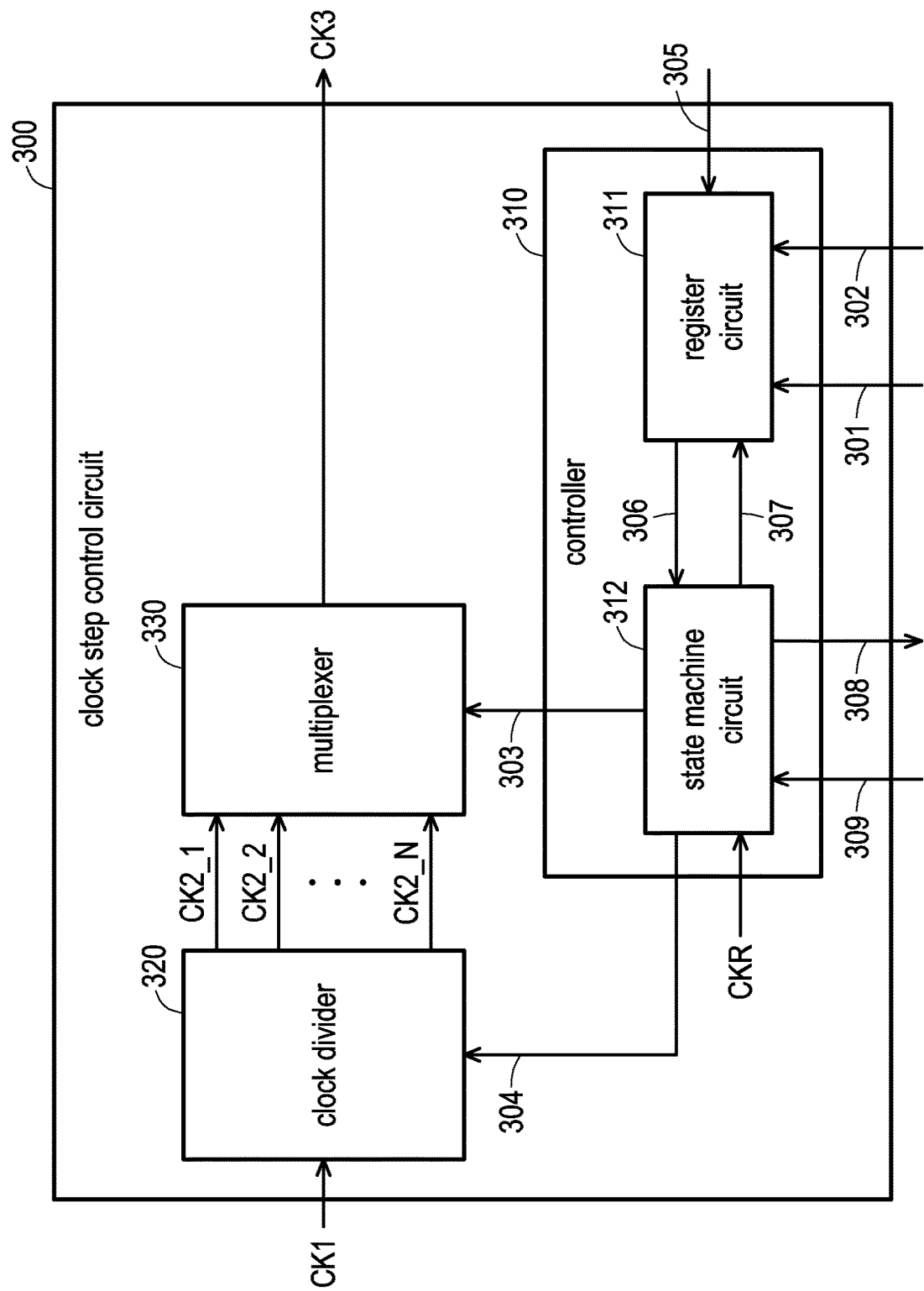
FIG. 3 is a schematic circuit view of a clock step control circuit according to another embodiment of the disclosure.

FIG. 3 is a schematic circuit view of a clock step control circuit according to another embodiment of the disclosure. Referring to FIG. 3, a clock step control circuit 300 includes a controller 310, a clock divider 320, and a multiplexer 330. The controller 310 includes a register circuit 311 and a state machine circuit 312. The register circuit 311 is coupled to the state machine circuit 312. The state machine circuit 312 is coupled to the clock divider 320 and the multiplexer 330. In the embodiment, when the register circuit 311 receives an interrupt signal, the register circuit 311 can output a control signal 306 to the state machine circuit 312. The state machine circuit 312 can output a selection signal 303 to the multiplexer 330 according to the control signal 306 and output a clock division signal 304 to the clock divider 320, so that the clock divider 320 can output a plurality of second clock signals CK2_1-CK2_N to the multiplexer 330 according to the clock division signal 304, and the multiplexer 330 can change the output according to the selection signal 303.

In the embodiment, the register circuit 311 can obtain frequency modulation data 305 through a bus so as to pre-store frequency modulation setting parameters according to the frequency modulation data 305. Therefore, when the register circuit 311 receives the interrupt signal, the register circuit 311 can generate the corresponding control signal 306 according to the interrupt signal and the frequency modulation setting parameters. In the embodiment, the state machine circuit 312 may also receive a reference clock signal CKR and power information 309. The state machine circuit 312 can generate the corresponding selection signal 303 and the clock division signal 304 according to the control signal 306 and the power information 309, and the state machine circuit 312 can output the selection signal 303 and the clock division signal 304. The state machine circuit 312 can effectively synchronously control the clock divider 320 and the multiplexer 330 based on the reference clock signal CKR.

In the embodiment, when the register circuit 311 receives the interrupt signal, the multiplexer 330 can sequentially output at least part of the second clock signals CK2_1-CK2_N in the form of multi-step changing from high clock frequency to low clock frequency to achieve multi-step frequency reduction. In the embodiment, the interrupt signal may include at least one of a first overcurrent warning signal 301 and a second overcurrent warning signal 302. The first overcurrent warning signal 301 may have a current greater than the first current threshold in response to the average current of the system-on-a-chip. The second overcurrent warning signal 302 may have a current greater than the second current threshold in response to the instantaneous current of the system-on-a-chip. The second current threshold may be greater than the first current threshold. Accordingly, the clock step control circuit 300 of the embodiment can adjust the clock frequency of the corresponding core clock signal based on the two overcurrent conditions.

In the embodiment, when the controller 310 receives the first overcurrent warning signal 301, the multiplexer 330 may sequentially output at least part of the second clock signals CK2_1 to CK2_N as the core clock signal CK3 in the form of multi-step changing from high clock frequency to low clock frequency during a first response period. Moreover, when the controller 310 receives the second overcurrent warning signal 302, the multiplexer 330 may sequentially output at least part of the second clock signals CK2_1 to CK2_N as the core clock signal CK3 in the form of multi-step changing from high clock frequency to low clock frequency during a second response period. In the embodiment, the time length of the first response period may be greater than the time length of the second response period. In other words, when the average operating current of the system-on-a-chip in a period is greater than the first current threshold, the clock step control circuit 300 can gradually reduce the clock frequency of the core clock signal CK3 provided to the core in steps. Moreover, when the instantaneous operating current of the system-on-a-chip is greater than the second current threshold, the clock step control circuit 300 can quickly reduce the clock frequency of the core clock signal CK3 provided to the core in steps.

Note that when the controller 310 first receives the first overcurrent warning signal 301 and gradually reduces the frequency (the operation of reducing the frequency has not been completed), if the controller 310 subsequently receives the second overcurrent warning signal 302, the controller 310 can control the multiplexer 330 to quickly reduce the clock frequency of the core clock signal CK3 provided to the core. In other words, the second overcurrent warning signal has a switching priority higher than that of the first overcurrent warning signal. Moreover, in the embodiment, when the controller 310 completes the operation of reducing the frequency of the core clock signal CK3, and the multiplexer 330 outputs the core clock signal CK3 with a low clock frequency, the state machine circuit 312 can output a state signal 307 to the register circuit 311 according to the switching result of the core clock signal CK3, and the recording is triggered by a deduction of the clock frequency recorded in the register circuit 311 to be cleared, for example. Moreover, the state machine circuit 312 may also output a state signal 308 to the core of the system-on-a-chip to notify the core that the operation of reducing the frequency has been completed.

In the embodiment, when the interrupt signal is de-asserted, the multiplexer 330 can sequentially output at least part of the second clock signals CK2_1-CK2_N in the form of multi-step changing from low clock frequency to high clock frequency during the recovery period. In other words, when there is no overcurrent in the system-on-a-chip, the clock step control circuit 300 can gradually increase the clock frequency of the core clock signal CK3 provided to the core. In the embodiment, the time length of the recovery period may be equal to the time length of the first response period or the second response period, but the disclosure is not limited thereto.

Figure 4:
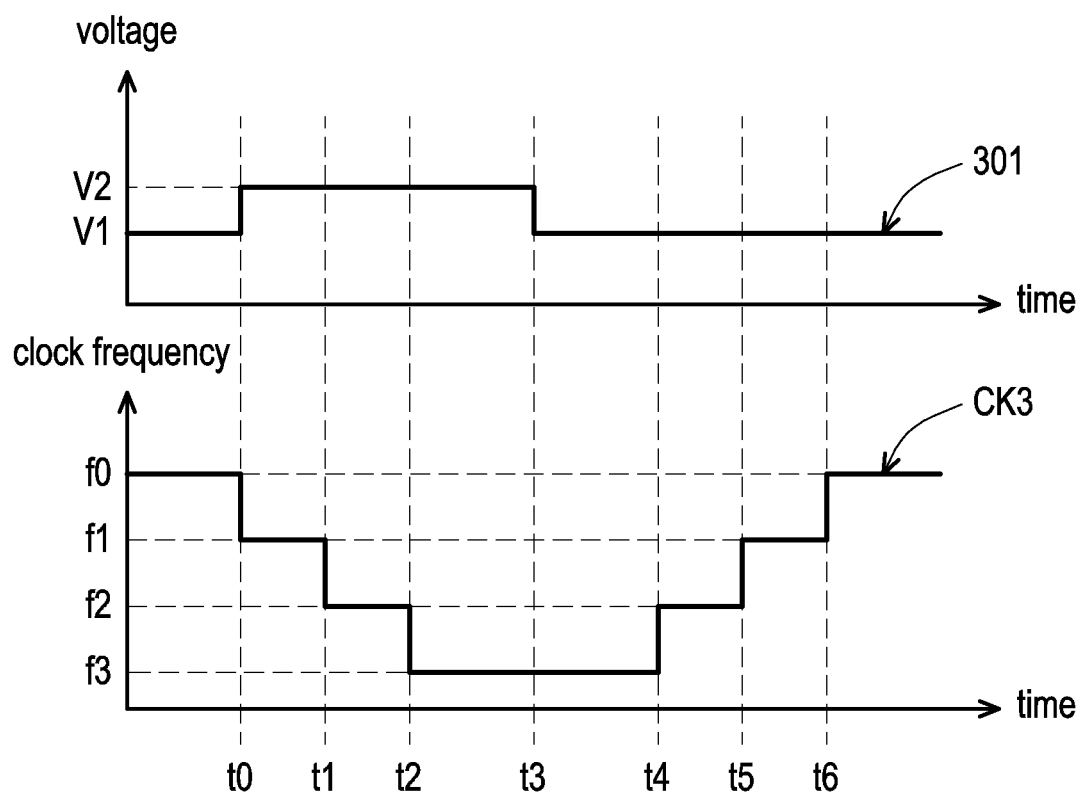
FIG. 4 is a schematic view illustrating changes of a clock signal according to an embodiment of the disclosure.

FIG. 4 is a schematic view illustrating changes of a clock signal according to an embodiment of the disclosure. Referring to FIG. 3 and FIG. 4, for example, the first overcurrent warning signal 301 may be a voltage signal having a voltage change as shown in FIG. 4, and the second overcurrent warning signal 302 may also be a voltage signal having the same or similar voltage change as shown in FIG. 4. Note that in the embodiment, the first clock signal CK1 may have a clock frequency CLK, for example. For example, the second clock signals CK2_1 to CK2_N may have clock frequencies (CLK/n) to (CLK/n+N−1), respectively, where n is a positive integer, and (n+N−1) is less than 64. In other words, when the multiplexer 130 sequentially outputs the clock signal in the form of multi-step changing from high clock frequency to low clock frequency, the frequency reduction ratio of the first step can be n/(n+1), the frequency reduction ratio of the second step can be (n+1)/(n+2), and so on. Note that the frequency reduction ratio of each step can range from 15% to 20%.

In the embodiment, the period from time t0 to time t3 may be the response step of overcurrent protection, and the period from time t3 to time t6 may be the recovery step of overcurrent protection. At time t0, when the register circuit 311 receives the first overcurrent warning signal 301 changing from a voltage V1 (low voltage level) to a voltage V2 (high voltage level), it indicates that the average operating current of the system-on-a-chip is greater than the first current threshold within a period of time. In the embodiment, the register circuit 311 can output the control signal 306 to the state machine circuit 312 so that the state machine circuit 312 can control the multiplexer 330 to change from outputting the core clock signal CK3 (e.g., the second clock signal CK2_1) having a clock frequency f0 (e.g., CLK/n) to outputting the core clock signal CK3 (e.g., a second clock signal CK2_2) having a clock frequency f1 (e.g., CLK/(n+1)), for example.

Then, after waiting for the frequency reduction waiting period of several reference clock cycles of the reference clock signal CKR, at time t1, for example, the state machine circuit 312 may control the multiplexer 330 to change from outputting the core clock signal CK3 (e.g., a second clock signal CK2_2) having the clock frequency f1 (e.g., CLK/(n+1)) to outputting the core clock signal CK3 (e.g., a second clock signal CK2_3) having the clock frequency f2 (e.g. CLK/(n+2)).

Then, after waiting for the frequency reduction waiting period of several reference clock cycles of the reference clock signal CKR, at time t2, for example, the state machine circuit 312 may control the multiplexer 330 to change from outputting the core clock signal CK3 (e.g., the second clock signal CK2_3) having the clock frequency f2 (e.g., CLK/(n+2)) to outputting the core clock signal CK3 (e.g., the second clock signal CK2_4) having a clock frequency f3 (e.g., CLK/(n+3)). Accordingly, the clock step control circuit 300 can complete the operation of reducing the frequency of the core clock signal CK3 at time t2.

However, note that between time t0 and time t2, when the register circuit 311 receives the second overcurrent warning signal 302 changing from the voltage V1 to the voltage V2, it indicates that the instantaneous operating current of the system-on-a-chip is greater than the second current threshold. In the embodiment, the register circuit 311 can output the control signal 306 to the state machine circuit 312, so that the state machine circuit 312 can control the multiplexer 330 to shorten the time length of the core clock signal CK3 in sequentially changing from the clock frequency f0 to the clock frequency f3, so as to quickly change to output the core clock signal CK3 (e.g., the second clock signal CK2_4) having the clock frequency f3 (e.g., CLK/(n+3)). For example, between time t0 and time t1, when the register circuit 311 receives the second overcurrent warning signal 302 changing from the voltage V1 to the voltage V2, the state machine circuit 312 can control the multiplexer 330 to quickly reduce the clock frequency of the core clock signal CK3 from the clock frequency f1 to the clock frequency f2 to the clock frequency f3 in steps before time t2. Accordingly, the clock step control circuit 300 can still effectively maintain the operation of the core when the overcurrent event of the system-on-a-chip occurs, so as to prevent the system from being shut down and then interrupting the processing operation of the core.

However, note that in other embodiments of the disclosure, when the register circuit 311 receives the second overcurrent warning signal 302 changing from the voltage V1 to the voltage V2, the multiplexer 330 can also reduce the clock frequency of the core clock signal CK3 by adopting few changing levels (higher frequency reduction ratio). For example, the multiplexer 330 sequentially changes the clock frequency of the core clock signal CK3 from the clock frequency f1 to the clock frequency f2 to the clock frequency f3.

Next, at time t3, when the register circuit 311 receives the first overcurrent warning signal 301 changing from the voltage V2 (high voltage level) to the voltage V1 (low voltage level), it indicates that the first overcurrent warning signal 301 is de-asserted. In the embodiment, at time t4, the register circuit 311 can output the control signal 306 to the state machine circuit 312, so that the state machine circuit 312 can control the multiplexer 330 to change from outputting the core clock signal CK3 (e.g., the second clock signal CK2_4) having the clock frequency f3 (e.g., CLK/(n+3)) to outputting the core clock signal CK3 (e.g., the second clock signal CK2_3) having the clock frequency f2 (e.g., CLK/(n+2)), for example.

Then, after waiting for the frequency increase waiting period of several reference clock cycles of the reference clock signal CKR, at time t5, the state machine circuit 312 can control the multiplexer 330 to change from outputting the core clock signal CK3 (e.g., the second clock signal CK2_3) having the clock frequency f3 (e.g., CLK/(n+2)) to outputting the core clock signal CK3 (e.g., the second clock signal CK2_2) having the clock frequency f1 (e.g. CLK/(n+1)), for example.

Then, after waiting for the frequency increase waiting period of several reference clock cycles of the reference clock signal CKR, at time t6, the state machine circuit 312 can control the multiplexer 330 to change from outputting the core clock signal CK3 (e.g., the second clock signal CK2_2) having the clock frequency f1 (e.g., CLK/(n+1)) to outputting the core clock signal CK3 (e.g., the second clock signal CK2_1) having the clock frequency f0 (e.g., CLK/(n)), for example.

Accordingly, the clock step control circuit 300 can recover the clock frequency of the core clock signal CK3 at time t6. Therefore, the clock step control circuit 300 of the embodiment can automatically reduce the core clock frequency of the core of the system-on-a-chip automatically corresponding to the overcurrent event of the system-on-a-chip, so as to implement the effective overcurrent protection function for the core. Moreover, when the overcurrent event ends, the core clock frequency of the core of the system-on-a-chip can be automatically increased to restore the performance of the core.

Moreover, note that the frequency modulation data 305 of the embodiment may include the time length, the frequency reduction ratio, the frequency increase ratio, and the number of reducing/increasing the frequency of each response period in the operations of reducing and increasing the clock frequency, and related frequency modulation parameters of the waiting time between frequency reduction and frequency increase. Therefore, after the register circuit 311 is disposed, corresponding control signals can be output according to different overcurrent warning signals, so as to control the multiplexer 330 to implement the operations of reducing and increasing the clock frequency.

Figure 5:
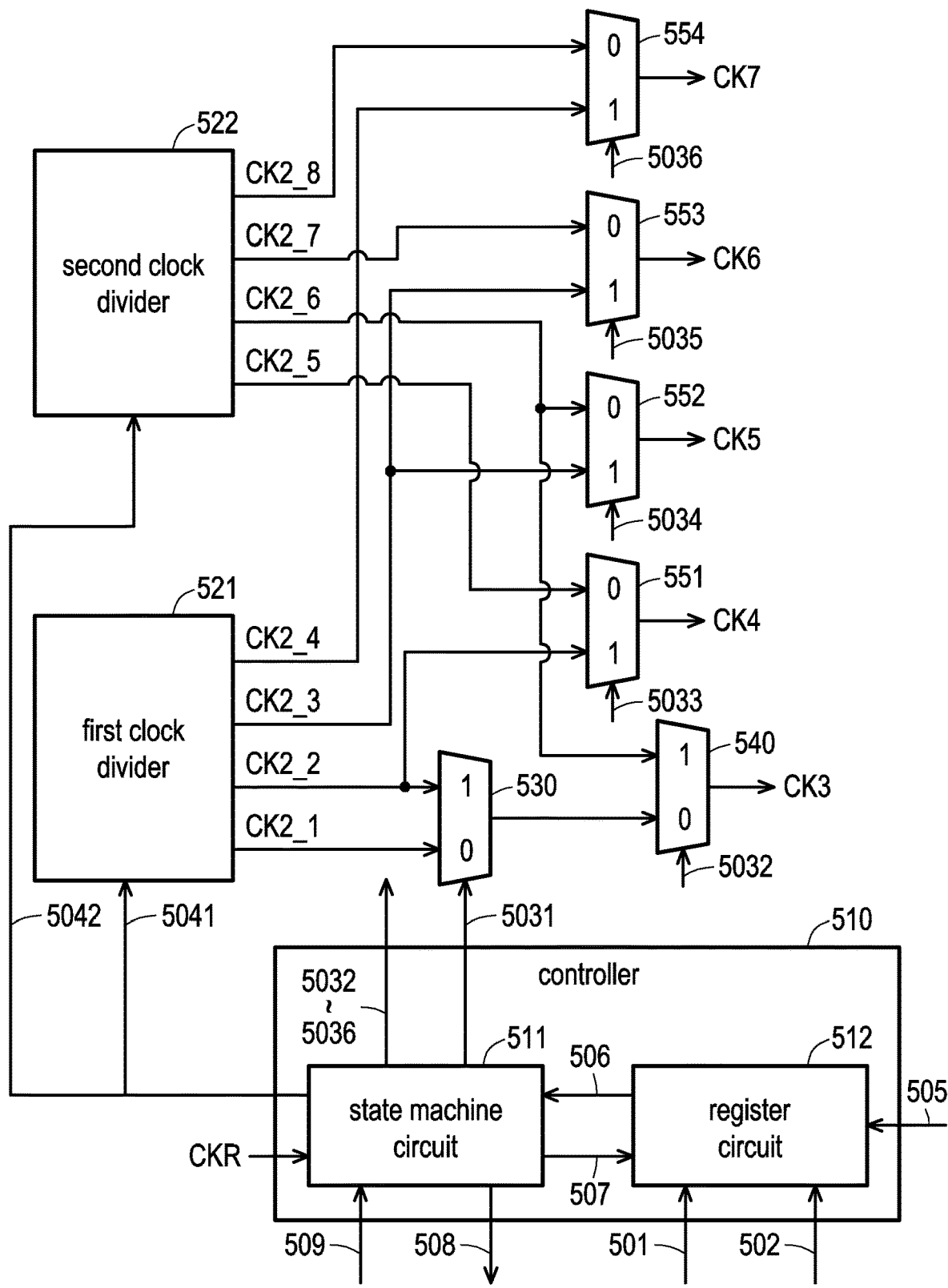
FIG. 5 is a schematic circuit view of a clock step control circuit according to yet another embodiment of the disclosure.

FIG. 5 is a schematic circuit view of a clock step control circuit according to yet another embodiment of the disclosure. Referring to FIG. 5, a clock step control circuit 500 includes a controller 510, a first clock divider 521, a second clock divider 522, and multiplexers 530, 540, and 551-554. The controller 510 includes a register circuit 512 and a state machine circuit 511. The register circuit 512 is coupled to the state machine circuit 511. The state machine circuit 511 is coupled to the clock dividers 521 and 522 and the multiplexers 530, 540, and 551-554. An input end of the second clock divider 522 is coupled to an output of the first clock divider 521 to receive a clock signal output by the first clock divider 521. In the embodiment, the register circuit 512 can receive a first overcurrent warning signal 501, a second overcurrent warning signal 502, and frequency modulation data 505. The register circuit 512 can receive a state signal 507 from the state machine circuit 511 and output the control signal 506 to the state machine circuit 511. The state machine circuit 511 can output selection signals 5031-5036 to the multiplexers 530, 540, and 551-554, respectively to control the multiplexers 530, 540, and 551-554. The state machine circuit 512 can output division signals 5041 and 5042 to the first clock divider 521 and the second clock divider 522, respectively. The state machine circuit 511 can output a state signal 508, and the state machine circuit 511 can also receive the reference clock signal CKR and power information 509.

Note that the embodiment is a specific implementation example of FIG. 3. Therefore, for the relevant circuit features, signal content, and implementation of the clock step control circuit 500 in the embodiment, refer to the illustration of the embodiment in FIG. 3 to obtain sufficient teachings, suggestions, and implementation descriptions, which is not iterated herein.

Compared with FIG. 3, two clock dividers and multiple multiplexers can be disposed in the clock step control circuit 500 in the embodiment. In the embodiment, for example, the first clock divider 521 may divide the frequency of the first clock signal with 4 GHz to generate the second clock signals CK2_1 to CK2_4. For example, the second clock divider 522 may divide the frequency of the first clock signal with 7.9 GHz to generate the second clock signals CK2_5-CK2_8. In other words, the first clock divider 521 and the second clock divider 522 may correspond to different phase-locked loop circuits that provide different first clock signals, respectively.

In the embodiment, the first clock divider 521 is coupled to the multiplexers 530, 551-554. The first clock divider 521 provides the second clock signals CK2_1 and CK2_2 to the multiplexer 530. The first clock divider 521 provides the second clock signal CK2_2 to the multiplexer 551. The first clock divider 521 provides the second clock signal CK2_3 to the multiplexers 552 and 553. The first clock divider 521 provides the second clock signal CK2_4 to the multiplexer 554. The second clock divider 522 is coupled to the multiplexers 540 and 551-554. The second clock divider 522 provides the second clock signal CK2_5 to the multiplexer 551. The second clock divider 522 provides the second clock signal CK2_6 to the multiplexers 540 and 552. The second clock divider 522 provides the second clock signal CK2_7 to the multiplexer 553. The second clock divider 522 provides the second clock signal CK2_8 to the multiplexer 554.

In the embodiment, the clock step control circuit 500 may be disposed in a chip for performing image processing functions, for example. The multiplexer 540 may output one of the second clock signals CK2_1, CK2_2, and CK2_6 as the core clock signal CK3 according to the selection signal 5032, for example. The multiplexer 551 may output the second clock signal CK2_2 and CK2_5 as a clock signal CK4 according to the selection signal 5033, for example. The clock signal CK4 can be disposed in a data transceiver circuit in a system-on-a-chip, for example. The multiplexer 552 may output the second clock signals CK2_3 and CK2_6 as a clock signal CK5 according to the selection signal 5034, for example. The clock signal CK5 can be disposed in a related system circuit in a system-on-a-chip, for example. The multiplexer 553 may output the second clock signals CK2_3 and CK2_7 as a clock signal CK6 according to the selection signal 5035, for example. The clock signal CK6 can be disposed in an image decoding circuit in a system-on-a-chip, for example. The multiplexer 554 may output the second clock signals CK2_4 and CK2_8 according to the selection signal 5036 as a clock signal CK7, for example. The clock signal CK7 can be disposed in an image encoding circuit in a system-on-a-chip, for example.

In the embodiment, when the register circuit 512 receives at least one of the interrupt signals, the first overcurrent warning signal 501, and the second overcurrent warning signal 502, the register circuit 512 can output the control signal 506 to the state machine circuit 511. The state machine circuit 511 can output the selection signals 5031 and 5032 to the multiplexers 530 and 540 according to the control signal 506 and output the division signals 5041 and 5042 to the first clock divider 521 and the second clock divider 522, so that the first clock divider 521 can output the second clock signals CK2_1 and CK2_2 to the multiplexer 530 according to the clock division signal 5041, and the second clock divider 522 can output the second clock signal CK2_6 to the multiplexer 540 according to the clock division signal 5042. In the embodiment, the second clock signals CK2_1, CK2_2, and CK2_6 have different clock frequencies. The second clock signal CK2_1 has the highest clock frequency, for example; the second clock signal CK2_6 has the lowest clock frequency, for example; and the clock frequency of the second clock signal CK2_2 ranges from the second clock signal CK2_1 to the second clock signal CK2_6. In this regard, the state machine circuit 512 can sequentially switch and output the second clock signals CK2_1, CK2_2, and CK2_6 as the core clock signal CK3 by controlling the multiplexers 530 and 540 so as to implement the gradual reduction of the clock frequency of the core clock signal CK3. Alternatively, the state machine circuit 511 can directly change from outputting the second clock signal CK2_1 to outputting the second clock signal CK2_6 as the core clock signal CK3 by controlling the multiplexers 530 and 540 so as to implement the immediate reduction of the clock frequency of the core clock signal CK3.

Similarly, when the register circuit 512 receives at least one of the interrupt signal, the first overcurrent warning signal 501, and the second overcurrent warning signal 502, the state machine circuit 511 can control the multiplexers 551 to 554 respectively, so that the multiplexers 551 to 554 can switch their output clock signals respectively. Therefore, the clock step control circuit 500 of the embodiment can automatically adjust the clock frequency of the core of the system-on-a-chip and other related circuits automatically corresponding to the overcurrent event of the system-on-a-chip so as to implement efficient overcurrent protection of the overall circuits of the system-on-a-chip.

Moreover, the clock step control circuit 500 of the embodiment can also be used when the phase-locked loop circuit corresponding to the first clock divider 521 requires re-programming when the overcurrent protection operation is not performed. The controller 510 can also control the multiplexers 530, 540, and 551 to 554 respectively, so that the multiplexers 530, 540, and 551 to 554 respectively output multiple second clock signals provided by the second clock divider 522. Moreover, when the phase-locked loop circuit of the first clock divider 521 is re-started and re-lock the frequency of the voltage-controlled oscillator to stabilize, the controller 510 can again control the multiplexers 530, 540, and 551 to 554 to restore and output the multiple second clock signals provided by the first clock divider 521.

In summary, with the clock step control circuit and clock step control method of the disclosure, the clock frequency of the core clock signal provided to the core of the system-on-a-chip can be adjusted correspondingly according to the interrupt signal provided by the system-on-a-chip to effectively prevent overcurrent events that cause the system shutdown, abnormal operations of the core, or even chip damage. Moreover, the clock step control circuit and clock step control method of the disclosure can provide overcurrent protection mechanisms with two frequency reduction methods, so that the performance of the core can be effectively reduced when different overcurrent events occur.

It will be apparent to those skilled in the art that various modifications and variations can be made to the structure of the present disclosure without departing from the scope or spirit of the invention. In view of the foregoing, it is intended that the present disclosure cover modifications and variations of this disclosure provided they fall within the scope of the following claims and their equivalents.

What is claimed is:

1. A clock step control circuit, comprising:
a clock divider, receiving a first clock signal and outputting a plurality of second clock signals;
a multiplexer, receiving the plurality of the second clock signals and outputting one of the plurality of the second clock signals; and
a controller, coupled to the clock divider and the multiplexer,
wherein, when the controller receives an interrupt signal, the controller outputs a selection signal to the multiplexer according to the interrupt signal, and the multiplexer outputs another one of the plurality of the second clock signals according to the selection signal,
wherein the plurality of the second clock signals comprise different clock frequencies, and
when the controller receives the interrupt signal, the multiplexer sequentially outputs at least part of the plurality of the second clock signals in a form of multi-step changing from high clock frequency to low clock frequency.

2. The clock step control circuit according to claim 1, wherein the interrupt signal comprises at least one of a first overcurrent warning signal and a second overcurrent warning signal,
wherein the first overcurrent warning signal in response to an average current of a system-on-a-chip comprises a current greater than a first current threshold,
wherein the second overcurrent warning signal in response to an instantaneous current of the system-on-a-chip comprises a current greater than a second current threshold.

3. The clock step control circuit according to claim 2, wherein
when the controller receives the first overcurrent warning signal, the multiplexer sequentially outputs at least part of the plurality of the second clock signals in the form of multi-step changing from high clock frequency to low clock frequency during a first response period,
when the controller receives the second overcurrent warning signal, the multiplexer sequentially outputs at least part of the plurality of the second signals in the form of multi-step changing from high clock frequency to low clock frequency during a second response period, and
a time length of the first response period is greater than a time length of the second response period.

4. The clock step control circuit according to claim 3, wherein a switching priority of the second overcurrent warning signal is higher than that of the first overcurrent warning signal.

5. The clock step control circuit according to claim 1, wherein when the interrupt signal is de-asserted, the multiplexer sequentially outputs the at least part of the plurality of the second clock signals in a form of multi-step changing from low clock frequency to high clock frequency during a recovery period.

6. The clock step control circuit according to claim 1, wherein the controller comprises:
a state machine circuit, coupled to the clock divider and the multiplexer; and a register circuit, coupled to the state machine circuit,
wherein when the register circuit receives the interrupt signal, the register circuit outputs a control signal to the state machine circuit, and the state machine circuit outputs the selection signal to the multiplexer according to the control signal and outputs a clock division signal to the clock divider, so that the clock divider outputs the plurality of the second clock signals according to the clock division signal, and the multiplexer changes an output according to the selection signal.

7. The clock step control circuit according to claim 6, wherein the register circuit is written with frequency modulation setting parameters in advance, and the register circuit generates the control signal according to the interrupt signal and the frequency modulation setting parameters.

8. The clock step control circuit according to claim 6, wherein the state machine circuit outputs a state signal to the register circuit according to a switching state of a current clock signal.

9. The clock step control circuit according to claim 1, further comprising:
    another clock divider, coupled to the controller and outputting another second clock signal;
    another multiplexer, coupled to the controller, an output of the multiplexer and the another clock divider, receive the another second clock signal,
    wherein the controller further outputs another selection signal to the another multiplexer, so that the another multiplexer determines to output one of the plurality of the second clock signals and the another second clock signal according to the another selection signal.

10. A clock step control method, comprising:
    receiving a first clock signal through a clock divider and outputting a plurality of second clock signals;
    receiving the plurality of the second clock signals through a multiplexer and outputting one of the plurality of the second clock signals;
    wherein, outputting a selection signal to the multiplexer according to an interrupt signal through a controller when the controller receives the interrupt signal; and
    outputting another one of the plurality of the second clock signals according to the selection signal through the multiplexer,
    wherein the plurality of the second clock signals comprises different clock frequencies, and the step of outputting the another one of the plurality of the second clock signals according to the selection signal through the multiplexer comprises:
    sequentially outputting at least part of the plurality of the second clock signals in a form of multi-step changing from high clock frequency to low clock frequency through the multiplexer.

11. The clock step control method according to claim 10, wherein the interrupt signal comprises at least one of a first overcurrent warning signal and a second overcurrent warning signal,
    wherein the first overcurrent warning signal in response to an average current of a system-on-a-chip comprises a current greater than a first current threshold,
    wherein the second overcurrent warning signal in response to an instantaneous current of the system-on-a-chip comprises a current greater than a second current threshold.

12. The clock step control method of claim 11, wherein the step of sequentially outputting at least part of the plurality of the second clock signals in a form of multi-step changing from high clock frequency to low clock frequency through the multiplexer comprises:
    sequentially outputting at least part of the plurality of the second clock signals through the multiplexer in the form of multi-step changing from high clock frequency to low clock frequency during a first response period when the controller receives the first overcurrent warning signal, and
    sequentially outputting at least part of the plurality of the second signals through the multiplexer in the form of multi-step changing from high clock frequency to low clock frequency during a second response period when the controller receives the second overcurrent warning signal,
    wherein a time length of the first response period is greater than a time length of the second response period.

13. The clock step control method of claim 12, wherein a switching priority of the second overcurrent warning signal is higher than that of the first overcurrent warning signal.

14. The clock step control method according to claim 10, further comprising:
    sequentially outputting the at least part of the plurality of the second clock signals through the multiplexer in a form of multi-step changing from low clock frequency to high clock frequency during a recovery period when the interrupt signal is de-asserted.

15. The clock step control method according to claim 10, wherein the controller comprises a state machine circuit and a register circuit, and when the register circuit receives the interrupt signal, the register circuit outputs a control signal to the state machine circuit, and the state machine circuit outputs the selection signal to the multiplexer according to the control signal and outputs a clock division signal to the clock divider, so that the clock divider outputs the plurality of the second clock signals according to the clock division signal, and the multiplexer changes an output according to the selection signal.

16. The clock step control method according to claim 15, wherein the register circuit is written with frequency modulation setting parameters in advance, and the register circuit generates the control signal according to the interrupt signal and the frequency modulation setting parameters.

17. The clock step control method of claim 15, wherein the state machine circuit outputs a state signal to the register circuit according to a switching state of a current clock signal.

18. The clock step control method according to claim 10, further comprising:
    outputting another second clock signal through another clock divider;
    receiving the another second clock signal through another multiplexer coupled to an output of the multiplexer, and further outputting another selection signal to the another multiplexer through the controller, so that the another multiplexer determines to output one of the plurality of the second clock signals and the another second clock signal according to the another selection signal.

* * * * *